(12) United States Patent
Nakayama et al.

(10) Patent No.: US 10,381,472 B2
(45) Date of Patent: Aug. 13, 2019

(54) NITRIDE-SEMICONDUCTOR FIELD-EFFECT TRANSISTOR

(71) Applicant: SHARP KABUSHIKI KAISHA, Sakai, Osaka (JP)

(72) Inventors: Yutaka Nakayama, Sakai (JP); Junichiroh Koyama, Sakai (JP); Koichiro Fujita, Sakai (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 351 days.

(21) Appl. No.: 15/554,676

(22) PCT Filed: Oct. 20, 2015

(86) PCT No.: PCT/JP2015/079599
§ 371 (c)(1),
(2) Date: Aug. 30, 2017

(87) PCT Pub. No.: WO2016/157581
PCT Pub. Date: Oct. 6, 2016

(65) Prior Publication Data
US 2018/0040726 A1 Feb. 8, 2018

(30) Foreign Application Priority Data

Mar. 31, 2015 (JP) .................. 2015-073617

(51) Int. Cl.
*H01L 29/778* (2006.01)
*H01L 29/40* (2006.01)
(Continued)

(52) U.S. Cl.
CPC ........ *H01L 29/7787* (2013.01); *H01L 23/291* (2013.01); *H01L 23/3171* (2013.01);
(Continued)

(58) Field of Classification Search
CPC ........... H01L 29/2003; H01L 29/66462; H01L 21/02458; H01L 29/4236; H01L 21/0254
See application file for complete search history.

(56) References Cited

U.S. PATENT DOCUMENTS 9,437,672 B2 * 9/2016 Okamoto .............. H01L 29/045
2005/0062069 A1 3/2005 Saito et al.
(Continued)

FOREIGN PATENT DOCUMENTS

JP 2005-93864 A 4/2005
JP 2008-243848 A 10/2008
(Continued)

*Primary Examiner* — Roy Potter
(74) *Attorney, Agent, or Firm* — Birch, Stewart, Kolasch & Birch, LLP (57) ABSTRACT

In a nitride-semiconductor field-effect transistor, an end on a recess side of a first insulating film is separated by a distance from an opening edge of the recess and an end on a recess side of a second insulating film is separated by a distance from the end on the recess side of the first insulating film. A part of a drain electrode out of the recess stretches toward a gate electrode side in an eaves shape, is formed over surfaces of the nitride semiconductor laminate, the first insulating film, and the second insulating film from the recess, and contacts the surfaces of the nitride semiconductor laminate, the first insulating film, and the second insulating film.

4 Claims, 5 Drawing Sheets (51) Int. Cl.
  *H01L 29/417* (2006.01)
  *H01L 23/31* (2006.01)
  *H01L 23/29* (2006.01)
  H01L 29/205 (2006.01)
  H01L 29/20 (2006.01)

(52) U.S. Cl.
  CPC ........ *H01L 23/3192* (2013.01); *H01L 29/408* (2013.01); *H01L 29/41766* (2013.01); *H01L 29/41775* (2013.01); H01L 29/2003 (2013.01); H01L 29/205 (2013.01)

(56) References Cited

U.S. PATENT DOCUMENTS

| | | |
|---|---|---|
| 2008/0035934 A1 | 2/2008 | Sheppard et al. |
| 2009/0215280 A1 | 8/2009 | Ring et al. |
| 2012/0068227 A1* | 3/2012 | Hikita ............... H01L 29/42316 257/194 |
| 2014/0092637 A1 | 4/2014 | Minoura et al. |
| 2015/0349108 A1 | 12/2015 | Fujita |

FOREIGN PATENT DOCUMENTS

| | | |
|---|---|---|
| JP | 2009-55042 A | 3/2009 |
| JP | 2014-29991 A | 2/2014 |
| JP | 2014-72360 A | 4/2014 |
| JP | 2014-86704 A | 5/2014 |

* cited by examiner

NITRIDE-SEMICONDUCTOR FIELD-EFFECT TRANSISTOR

TECHNICAL FIELD

The present invention relates to a nitride-semiconductor field-effect transistor that includes a nitride semiconductor laminate having a heterointerface.

BACKGROUND ART

Conventionally, there has been a nitride-semiconductor field-effect transistor disclosed in PTL 1 (Japanese Unexamined Patent Application Publication No. 2014-29991). The nitride-semiconductor field-effect transistor includes a nitride semiconductor laminate having a heterointerface. A recess that is recessed toward the heterointerface is provided on a surface of the nitride semiconductor laminate. An insulating film is also provided on the surface of the nitride semiconductor laminate so as to be separated by a predetermined distance from an opening edge of the recess. A drain electrode is formed over a surface of the insulating film from the recess of the nitride semiconductor laminate so as to be in contact with the surface of the nitride semiconductor laminate between the insulating film and the opening edge of the recess.

With such a structure, it is aimed to reduce ON-state maximum electric field strength at an end of the drain electrode adjacent to the nitride semiconductor laminate so that ON withstand voltage is improved.

CITATION LIST

Patent Literature

PTL 1: Japanese Unexamined Patent Application Publication No. 2014-29991

SUMMARY OF INVENTION

Technical Problem

However, the aforementioned conventional nitride-semiconductor field-effect transistor has a problem that suppression of collapse under high voltage during a switching operation is insufficient. The collapse is generally a phenomenon in which the drain current in a transistor is reduced during an operation of switching from an off-state to an on-state. However, under high voltage during a switching operation, which is to be solved by the invention, a phenomenon that is different from the known collapse phenomenon occurs.

Inventors have considered that the collapse under high voltage has a mechanism in which large current instantaneously flows in a high electric field near the drain electrode during the switching operation, and due to energy of the large current, electron traps are generated or semiconductor crystal is degraded, thus causing the collapse phenomenon.

Figure 9:
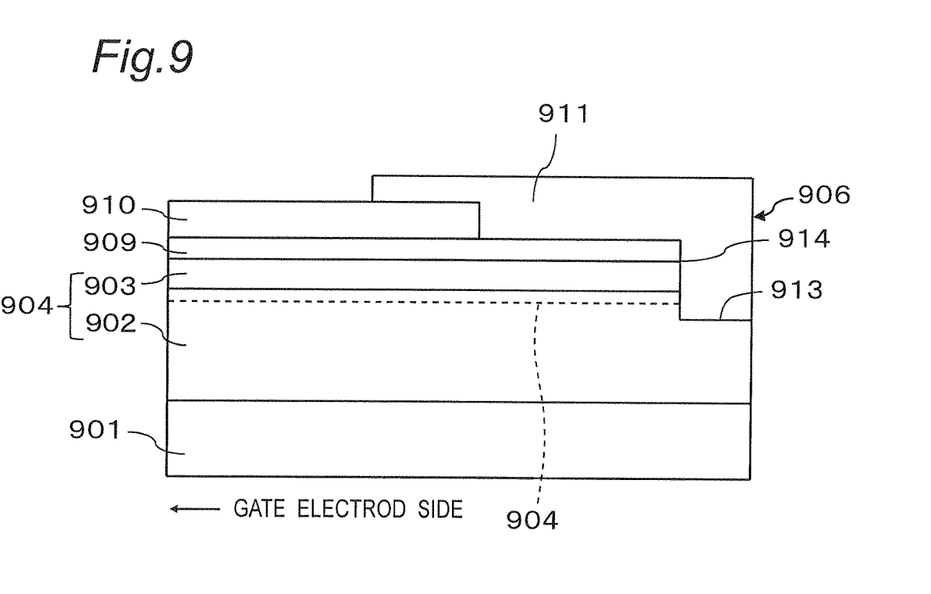
FIG. 9 is a schematic sectional view of a vicinity of a drain electrode of a nitride-semiconductor field-effect transistor of a reference example.

Thus, the inventors have studied about a structure of a reference example of FIG. 9 for suppression of the collapse under a high voltage operation. In the structure, a nitride semiconductor laminate 904 is formed on a substrate 901 made from Si. On the nitride semiconductor laminate 904, a first insulating film 909 is formed from a gate electrode (not illustrated) of a transistor to an opening edge 914 of a recess 913 of the nitride semiconductor laminate 904. On the first insulating film 909, a second insulating film 910 is formed so as not to cover a surface of an end on a recess 913 side of the first insulating film 909. Further, a field plate portion 911 of a drain electrode 906 of the transistor is formed over a surface of an end on a recess 913 side of the second insulating film 910 from the surface of the end on the recess 913 side of the first insulating film 909. Thereby, the field plate portion 911 contacts the surface of the end on the recess 913 side of the first insulating film 909 and also contacts the surface of the end on the recess 913 side of the second insulating film 910.

However, in the aforementioned structure, another problem that on-resistance is unstable and has variation is caused.

Thus, an object of the invention is to provide a nitride-semiconductor field-effect transistor that is able to suppress collapse even under high voltage during a switching operation and that has small variation in on-resistance.

Solution to Problem

In order to solve the aforementioned problem, a nitride-semiconductor field-effect transistor of the invention includes:

a nitride semiconductor laminate that has a heterointerface and has a recess recessed from a surface toward the heterointerface;

a source electrode that is arranged on the surface of the nitride semiconductor laminate;

a drain electrode that is arranged with an interval from the source electrode on the surface of the nitride semiconductor laminate and that is partially in the recess;

a gate electrode that is arranged between the source electrode and the drain electrode;

a first insulating film that is formed on the surface of the nitride semiconductor laminate and includes at least silicon and nitrogen as constituent elements; and a second insulating film that is formed on the first insulating film, in which an end on a recess side of the first insulating film is separated by a distance that is set in advance from an opening edge of the recess and an end on a recess side of the second insulating film is separated by a distance that is set in advance from the end on the recess side of the first insulating film, and a part of the drain electrode out of the recess stretches toward a gate electrode side in an eaves shape, is formed over surfaces of the nitride semiconductor laminate, the first insulating film, and the second insulating film from the recess, and contacts the surfaces of the nitride semiconductor laminate, the first insulating film, and the second insulating film.

In the nitride-semiconductor field-effect transistor according to an embodiment, the distance between the end on the recess side of the first insulating film and the opening edge of the recess is 0.1 µm or more and 1.5 µm or less.

In the nitride-semiconductor field-effect transistor according to an embodiment, the first insulating film has an area in contact with the surface of the nitride semiconductor laminate, and the area is made from SiN whose Si—H bonding amount is $6 \times 10^{21}$ $cm^{-3}$ or less.

In the nitride-semiconductor field-effect transistor according to an embodiment, an end surface on the recess side of the first insulating film is inclined at an angle of 30° or less relative to an interface between the nitride semiconductor laminate and the first insulating film.

A nitride-semiconductor field-effect transistor of the invention includes:

a nitride semiconductor laminate that has a heterointerface and has a recess recessed from a surface toward the heterointerface;

a source electrode that is arranged on the surface of the nitride semiconductor laminate;

a drain electrode that is arranged with an interval from the source electrode on the surface of the nitride semiconductor laminate and that is partially in the recess;

a gate electrode that is arranged between the source electrode and the drain electrode;

a first insulating film that is formed on the surface of the nitride semiconductor laminate, has an end on a recess side separated by a distance that is set in advance from an opening edge of the recess, and includes at least silicon and nitrogen as constituent elements;

a second insulating film that is formed on the first insulating film; and a third insulating film that has a part formed on the second insulating film and has another part formed on the surface of the nitride semiconductor laminate between the end on the recess side of the first insulating film and the opening edge of the recess, in which an end on a recess side of the third insulating film is separated by a distance that is set in advance from the opening edge of the recess, and a part of the drain electrode out of the recess stretches toward a gate electrode side in an eaves shape, is formed over surfaces of the nitride semiconductor laminate and the third insulating film from the recess, and contacts the surfaces of the nitride semiconductor laminate and the third insulating film.

Advantageous Effects of Invention

The nitride-semiconductor field-effect transistor of the invention is able to achieve a field-effect transistor which is able to suppress collapse even under high voltage during a switching operation by the nitride semiconductor laminate, the drain electrode, and the first and second insulating films, and in which on-resistance is stable.

DESCRIPTION OF EMBODIMENTS

The invention will be described below in detail with illustrated embodiments.

First Embodiment

Figure 1:
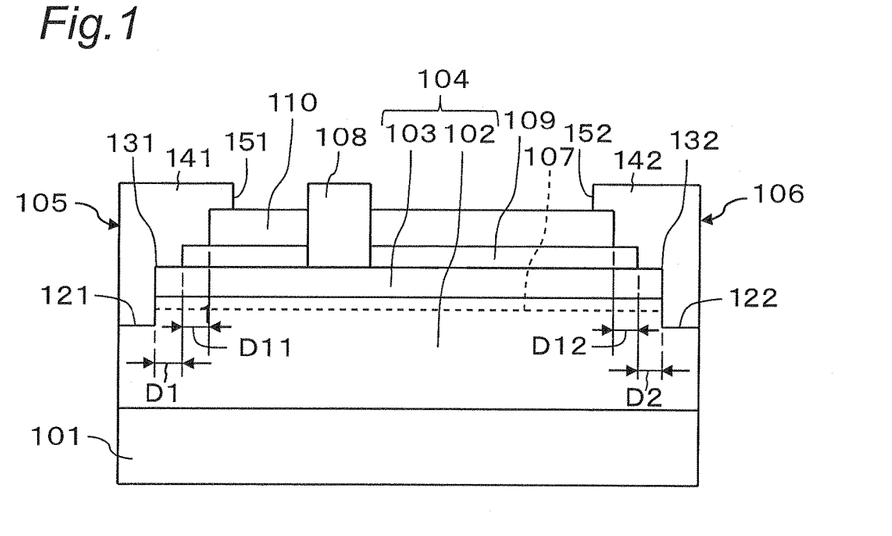
FIG. 1 is a schematic sectional view of a nitride-semiconductor field-effect transistor of a first embodiment of the invention.
Figure 2:
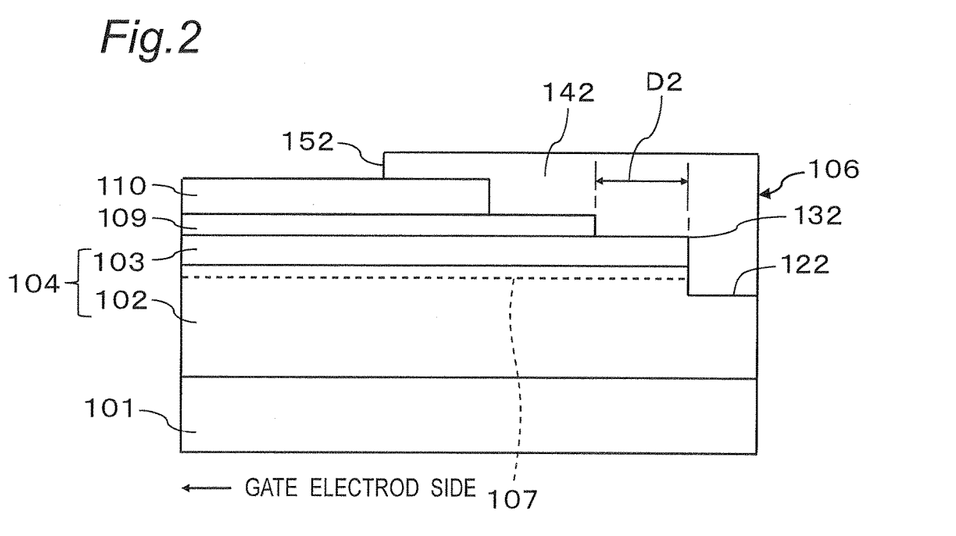
FIG. 2 is an enlarged view of a part in a vicinity of a drain electrode of FIG. 1.

FIG. 1 schematically illustrates a cross section when a nitride-semiconductor field-effect transistor of a first embodiment of the invention is taken along a plane perpendicular to a substrate surface. FIG. 2 illustrates an enlarged part of a vicinity of a drain electrode 106 of FIG. 1.

The nitride-semiconductor field-effect transistor is a nitride-semiconductor HFET (Hetero-junction Field Effect Transistor). The nitride-semiconductor field-effect transistor is formed in such a manner that a channel layer 102 made from GaN and a barrier layer 103 made from $Al_xGa_{1-x}N$ ($0<x<1$) are laminated in this order on a substrate 101 made from Si as illustrated in FIGS. 1 and 2. The channel layer 102 and the barrier layer 103 form a nitride semiconductor laminate 104. Note that, a ratio of Al crystal x of the $Al_xGa_{1-x}N$ barrier layer 103 is, for example, x=0.17 in the first embodiment. For example, thickness of the channel layer 102 is 1.0 μm and thickness of the barrier layer 103 is 30 nm in the first embodiment.

A source electrode 105 and the drain electrode 106 are formed with an interval that is set in advance on the barrier layer 103. As a material of the source electrode 105 and the drain electrode 106, for example, Ti/Al/TiN in which Ti, Al, and TiN are laminated in order is used. In the first embodiment, a recess 121 is formed in the barrier layer 103 and the channel layer 102 which are in a portion where the electrode 106 is formed, and a recess 122 is formed in the barrier layer 103 and the channel layer 102 which are in a portion where the electrode 106 is formed. Each of the recesses 121 and 122 reaches the GaN channel layer 102 through the $Al_xGa_{1-x}N$ barrier layer 103 from a surface of the $Al_xGa_{1-x}N$ barrier layer 103. When electrode materials are laminated and subjected to annealing, ohmic contact is formed between each of the source electrode 105 and the drain electrode 106, and a 2DEG (two dimensional electron gas) 107 which is formed on a surface layer of the channel layer 102. Note that, depth of the recesses 121 and 122 is set, for example, in a range of 50 nm to 150 nm.

A gate electrode 108 is formed between the source electrode 105 and the drain electrode 106 on the barrier layer 103. The gate electrode 108 is made from, for example, TiN, WN, or the like.

In the nitride-semiconductor field-effect transistor, a channel is formed by the 2DEG 107 generated near an interface between the channel layer 102 and the barrier layer 103. The channel is controlled by applying voltage to the gate electrode 108, so that the nitride-semiconductor HFET is turned on or off. More specifically, the nitride-semiconductor field-effect transistor is a normally-on transistor in which, when negative voltage is applied to the gate electrode 108, a depletion layer is formed in the channel layer 102 under the gate electrode 108 and a state is brought into an off state, and when voltage applied to the gate electrode 108 is zero, no depletion layer is formed in the channel layer 102 under the gate electrode 108 and the state is brought into an on state.

A first insulating film 109 made from $SiN_y$ is formed between the source electrode 105 and the gate electrode 108 on the barrier layer 103 and between the gate electrode 108 and the drain electrode 106 on the barrier layer 103. The first insulating film 109 is formed on a surface of the nitride semiconductor laminate 104 other than the recesses 121 and the 122. More specifically, an end on a recess 121 side of the first insulating film 109 is separated by a predetermined distance D1 from an opening edge 131 of the recess 121 along the surface of the barrier layer 103. On the other hand, an end on a recess 122 side of the first insulating film 109 is separated by a predetermined distance D2 from an opening edge 132 of the recess 122 along the surface of the barrier layer 103. An effect of the separation will be specifically described later. Note that, in the first embodiment, thickness of the first insulating film 109 is, for example, 30 nm, length of the distance D1 is, for example, 0.5 µm, and length of the distance D2 is, for example, 0.5 µm.

A function of the first insulating film 109 is interface control for the surface of the nitride semiconductor laminate 104. The interface control is control by which negative electric charge is less likely to be accumulated in an interface between the nitride semiconductor laminate 104 and the first insulating film 109 for suppressing collapse, and dangling bonds generated on the surface of the nitride semiconductor laminate 104 are appropriately terminated, so that occurrence of interface state is reduced and depth of the interface state is reduced, for example.

As described above, from a viewpoint of performing the interface control for the surface of the nitride semiconductor laminate 104, a relative dielectric constant of $SiN_y$ used for formation of the first insulating film 109 is desired to be in a range of 7.5 to 9.5. The first insulating film 109 is also desired to be a film having a higher composition of Si than a stoichiometric film. That is, it is desired to use $SiN_y$ ($y<4/3$) as the material of the first insulating film 109. In this case, when the composition of Si is too high, leak occurs, but when the relative dielectric constant of $SiN_y$ used for the first insulating film 109 is in a range of 7.5 to 9.5, leak is less likely to occur.

A second insulating film 110 made from $SiN_z$ is formed between the source electrode 105 and the gate electrode 108 on the first insulating film 109 and between the gate electrode 108 and the drain electrode 106 on the barrier layer 103. An end on the recess 121 side of the second insulating film 110 is separated by a predetermined distance D11 from an end on the recess 121 side of the first insulating film 109 along the surface of the first insulating film 109. On the other hand, an end on the recess 122 side of the second insulating film 110 is separated by a predetermined distance D12 from an end on the recess 122 side of the first insulating film 109 along the surface of the first insulating film 109. Note that, in the first embodiment, a film thickness of the second insulating film 110 is, for example, 230 nm, length of the distance D11 is, for example, 1.0 µm, and length of the distance D12 is, for example, 1.0 µm.

A part of the source electrode 105 is in the recess 121. A part of the source electrode 105 out of the recess 121 stretches toward a gate electrode 108 side in an eaves shape, is formed over surfaces of the nitride semiconductor laminate 104, the first insulating film 109, and the second insulating film 110 from the recess 121, and contacts the surfaces on the recess 121 side of the nitride semiconductor laminate 104, the first insulating film 109, and the second insulating film 110. That is, the source electrode 105 has a field plate portion 141 that stretches toward the gate electrode 108 side in an eaves shape and contacts the surface of the nitride semiconductor laminate 104, the surface of the first insulating film, and the surface of the second insulating film. Such a field plate structure makes it possible to prevent occurrence of breakage of the source electrode 105 at a step portion.

Length of the field plate portion 141 has a distance from the opening edge 131 to a tip end 151 of the field plate portion 141, and is, for example, 2.0 µm.

A part of the drain electrode 106 is in the recess 122. A part of the drain electrode 106 out of the recess 122 stretches toward the gate electrode 108 side in an eaves shape, is formed over surfaces of the nitride semiconductor laminate 104, the first insulating film 109, and the second insulating film 110 from the recess 122, and contacts the surfaces of the nitride semiconductor laminate 104, the first insulating film 109, and the second insulating film 110. That is, the drain electrode 106 has a field plate portion 142 that stretches toward the gate electrode 108 side in an eaves shape and contacts the surface of the nitride semiconductor laminate 104, the surface of the first insulating film 109, and the surface of the second insulating film 110. Such a field plate structure makes it possible to reduce electric field strength of a lower part of the field plate portion 142, particularly, electric field strength near the opening edge 132. Further, when the field plate portion 142 is formed so that thickness of the field plate portion 142 gradually increases toward the recess 122, electric field strength near the drain electrode 106 is able to be further reduced and occurrence of breakage of the drain electrode 106 at a step portion is able to be prevented.

Length of the field plate portion 142 is a distance from the opening edge 132 to a tip end 152 of the field plate portion 142, and is, for example, 2 µm.

A distance from the tip end 152 of the field plate portion 142 to the gate electrode 108 is set so as to be longer than a distance from the tip end 151 of the field plate portion 141 to the gate electrode 108 in FIG. 1.

Effect achieved when the first insulating film 109 is separated from the opening edge 132 of the recess 122 will be described below.

A reference example of FIG. 9 provides a structure in which a first insulating film 909 is formed from a gate electrode of a nitride-semiconductor field-effect transistor to an opening edge 914 (an edge of a contact surface of a drain electrode 906 and a nitride semiconductor laminate 904) of a recess 913 and the drain electrode 906 is in the recess 913. In such a case, the first insulating film 909 and the nitride semiconductor laminate 904 need to be successively subjected to etching processing. However, when a channel layer 902, a barrier layer 903, and the first insulating film 909 are respectively made from GaN, and $SiN_y$, an etching rate of $SiN_y$ is different from those of GaN and $Al_xGa_{1-x}N$. Thus, when $SiN_y$, GaN, and $Al_xGa_{1-x}N$ are successively subjected to etching, etching depth or a processing shape of an etching side is difficult to be controlled. Accordingly, ohmic contact resistance of the drain electrode 906 and a 2DEG 907 becomes unstable. Thereby, instability and variation of on-resistance are considered to be caused.

On the other hand, as illustrated in FIG. 2, in the case of a structure in which the first insulating film 109 is separated from the opening edge 132 of the recess 122, the first insulating film 109 and the nitride semiconductor laminate 104 are able to be separately processed. Thus, etching depth and a processing shape of an etching side are easy to be controlled. Accordingly, ohmic contact resistance of the drain electrode 106 and the 2DEG becomes stable. As a result, it is possible to realize the field-effect transistor in which on-resistance is stable.

According to more detailed study, when the distance D2 by which the end on the recess 122 side of the first insulating film 109 is separated from the opening edge 132 of the recess 122 is 0.1 µm or more, the first insulating film 109 and the nitride semiconductor laminate 104 are able to be separately processed, thus making it possible to achieve reliably stable ohmic contact resistance. When the distance D2 by which the first insulating film 109 is separated from the opening edge 132 of the recess 122 is greater than 1.5 µm, collapse under high voltage during a switching operation is not able to be sufficiently suppressed. Thus, it is desired that the distance D2 by which the first insulating film 109 is separated from the opening edge 132 of the recess 122 is 0.1 µm or more and 1.5 µm or less.

When the distance D12 by which the end on the recess 122 side of the second insulating film 110 is separated from the end on the recess 122 side of the first insulating film 109 is 0.5 µm or more, a processing shape of the field plate portion 142 becomes stable. When the distance D12 by which the end on the recess 122 side of the second insulating film 110 is separated from the end on the recess 122 side of the first insulating film 109 is greater than 2.0 µm, a part with high electric field strength is generated near the drain electrode 106. Thus, it is desired that the distance D12 by which the end on the recess 122 side of the second insulating film 110 is separated from the end on the recess 122 side of the first insulating film 109 is 0.5 µm or more and 2.0 µm or less.

In the first embodiment, the distance D1 and the distance D2 may be the same distance. That is, for example, the distance D1 may be set to 0.1 µm or more and 1.5 µm or less.

In the first embodiment, the distance D11 and the distance D12 may be the same distance. That is, for example, the distance D11 may be set to 0.5 µm or more and 2.0 µm or less.

In the first embodiment, the lengths of the field plate portion 141 and the field plate portion 142 are 2.0 µm, but may be appropriately changed in accordance with the lengths of the distances D1, D2, D11, and D12 and may be set to 1.0 µm or more and 4.0 µm or less.

Second Embodiment

Figure 3:
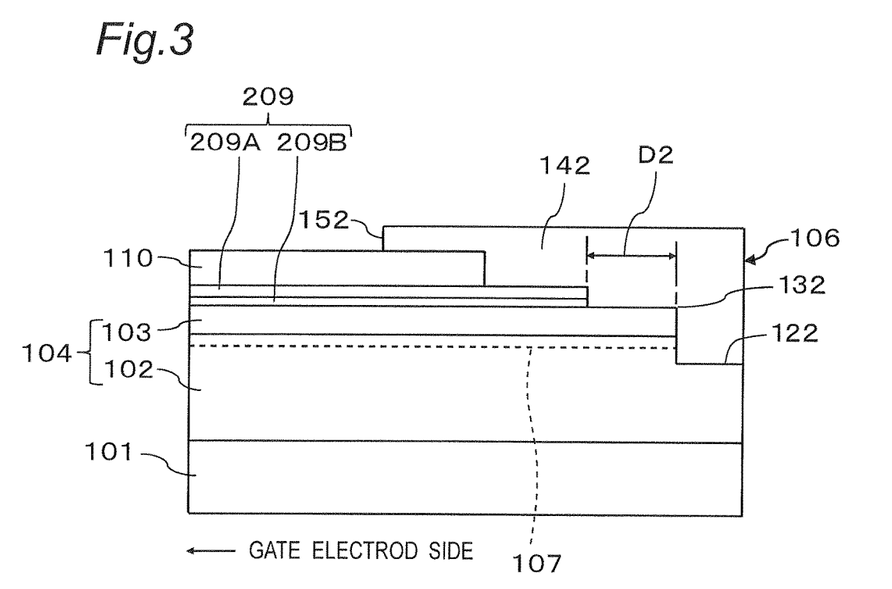
FIG. 3 is a schematic sectional view of a vicinity of a drain electrode of a nitride-semiconductor field-effect transistor of a second embodiment of the invention.

FIG. 3, is a schematic sectional view of a vicinity of a drain electrode 106 of a nitride-semiconductor field-effect transistor of a second embodiment of the invention. Note that, in FIG. 3, the same components as the components of the first embodiment are denoted by the same reference signs as those of the first embodiment. Also in the description below, the same components as the components of the first embodiment are denoted by the same reference signs as those of the first embodiment and description for the same components is omitted.

The nitride-semiconductor field-effect transistor is a nitride-semiconductor HFET and is different from that of the first embodiment only in that a first insulating film 209 different from the first insulating film 109 is included as illustrated in FIG. 3.

The first insulating film 209 is constituted by a first lower insulating film 209A that contacts the surface of the nitride semiconductor laminate 104 and a first upper insulating film 209B that is formed on the first lower insulating film 209A. While the field plate portion 142 does not contact a surface of the first lower insulating film 209A, the field plate portion 142 contacts a surface of an end on the recess 122 side of the first upper insulating film 209B.

As the first lower insulating film 209A, an SiN film in which an Si—H bonding amount is $3 \times 10^{21}$ cm$^{-3}$ is used. Thickness of the first lower insulating film 209A is, for example, 10 nm.

As the first upper insulating film 209B, an SiN film in which an Si—H bonding amount is greater than that of the SiN film of the first lower insulating film 209A is used. In this case, thickness of the first upper insulating film 209B is only required to be about, for example, 20 nm.

The inventors have conducted various study concerning the first lower insulating film 209A formed on the surface of the nitride semiconductor laminate 104. As a result, the inventors have found that usage of an insulating film that is made from SiN in which an Si—H bonding amount is equal to or less than $6 \times 10^{21}$ cm$^{-3}$ makes it possible to suppress an increase in leak current by a high-temperature and high-voltage stress test.

The high-temperature and high-voltage stress test is accelerated test in which while keeping the nitride-semiconductor field-effect transistor at temperature (for example, 150° C.) higher than temperature at which the nitride-semiconductor field-effect transistor is normally used and while a switching operation is in an off state, after continuation for a fixed time (for example, 1000 hours) at off voltage (for example, 600V) higher than off voltage at which the nitride-semiconductor field-effect transistor is normally used, an increase in leak current is evaluated. In order to use the nitride-semiconductor field-effect transistor as a switching device, it is essential that the increase in leak current is suppressed so that breakage of the nitride-semiconductor field-effect transistor is not caused by the leak current.

Similarly to the first embodiment, also when the first insulating film 209 formed by the first lower insulating film 209A and the first upper insulating film 209B is used, with a structure in which the first insulating film 209 is separated from the opening edge 132 of the recess 122, the first insulating film 209 and the nitride semiconductor laminate 104 are able to be separately processed. Thus, etching depth and a processing shape of an etching side are easy to be controlled also in the nitride-semiconductor field-effect transistor of the second embodiment, so that ohmic contact resistance of the drain electrode 106 and the 2DEG becomes stable. As a result, it is possible to achieve stable on-resistance of the nitride-semiconductor field-effect transistor of the second embodiment.

That is, in the second embodiment, it is possible to realize the nitride-semiconductor HFET in which on-resistance is stable and an increase in leak current by high-temperature and high-voltage stress test is suppressed.

Third Embodiment

Figure 4:
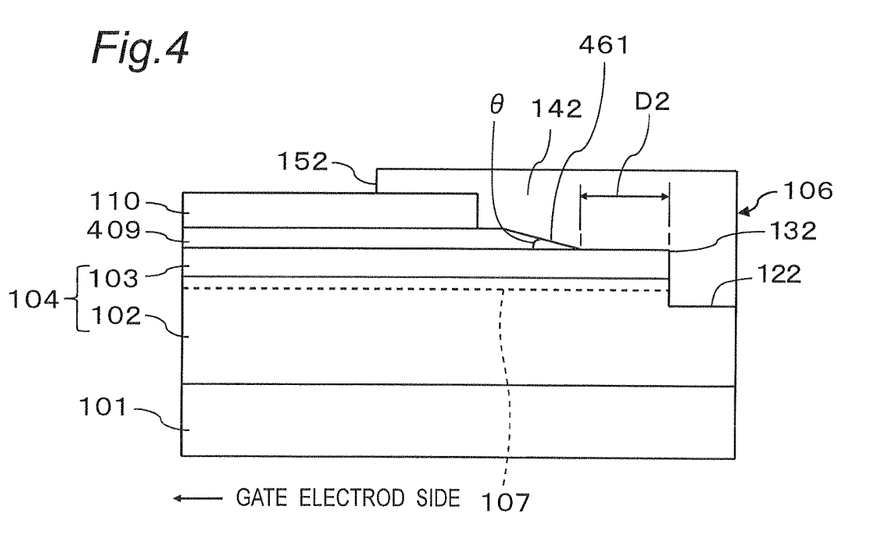
FIG. 4 is a schematic sectional view of a vicinity of a drain electrode of a nitride-semiconductor field-effect transistor of a third embodiment of the invention.

FIG. 4 is a schematic sectional view of a vicinity of a drain electrode 106 of a nitride-semiconductor field-effect transistor of a third embodiment of the invention. Note that, in FIG. 4, the same components as the components of the first embodiment are denoted by the same reference signs as those of the first embodiment. Also in the description below, the same components as the components of the first embodiment are denoted by the same reference signs as those of the first embodiment and description for the same components is omitted.

The nitride-semiconductor field-effect transistor is a nitride-semiconductor HFET and is different from that of the first embodiment only in that a first insulating film 409 different from the first insulating film 109 is included as illustrated in FIG. 4.

The first insulating film 409 is made from the same material as that of the first insulating film 109, but has a different shape of an end on the recess 122 side. More specifically, an end surface 461 on the recess 122 side of the first insulating film 409 is inclined at an angle of 15° relative to an interface between the nitride semiconductor laminate 104 and the first insulating film 109.

In such a case, it is possible to further reduce electric field strength of a lower part of the field plate portion 142 of the drain electric 106, particularly, electric field strength near the end surface 461 on the recess 122 side of the first insulating film 409, and it is also possible to prevent occurrence of breakage of the drain electrode 106 at a step portion.

It was found that the angle θ formed by the interface between the nitride semiconductor laminate 104 and the first insulating film 109 and the end surface 461 on the recess 122 side of the first insulating film 409 may not be 15° and effect of reduction of electric field strength becomes remarkable as long as it is equal to or less than 30°.

That is, in the third embodiment, it is possible to realize the nitride-semiconductor HFET in which on-resistance is stable and collapse is further suppressed even under high voltage during a switching operation.

Fourth Embodiment

Figure 5:
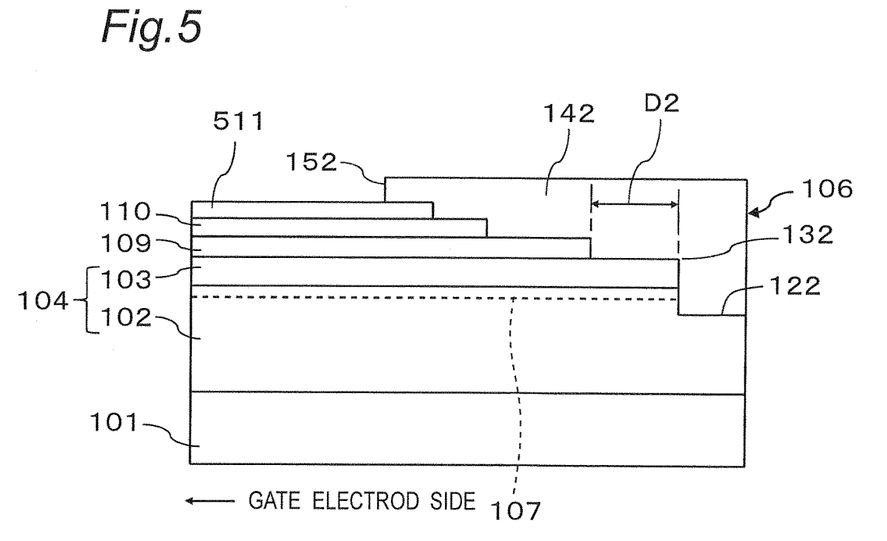
FIG. 5 is a schematic sectional view of a vicinity of a drain electrode of a nitride-semiconductor field-effect transistor of a fourth embodiment of the invention.

FIG. 5 is a schematic sectional view of a vicinity of a drain electrode 106 of a nitride-semiconductor field-effect transistor of a fourth embodiment of the invention. Note that, in FIG. 5, the same components as the components of the first embodiment are denoted by the same reference signs as those of the first embodiment. Also in the description below, the same components as the components of the first embodiment are denoted by the same reference signs as those of the first embodiment and description for the same components is omitted.

The nitride-semiconductor field-effect transistor is a nitride-semiconductor HFET and is different from that of the first embodiment only in that a third insulating film 511 is included as illustrated in FIG. 5.

The third insulating film 511 is formed on the surface of the second insulating film 110 and made from $SiO_2$. An end on the recess 122 side of the third insulating film 511 is separated by a predetermined distance from an end on the recess 122 side of the second insulating film 110. Note that, in the fourth embodiment, a film thickness of the second insulating film 110 is set to, for example, 100 nm. A film thickness of the third insulating film 511 is set to, for example, 200 nm.

As described above, when the insulating films that cover the surface of the nitride semiconductor laminate 104 and are positioned under the field plate portion 142 of the drain electrode 106 have a three-layer structure, the thickness of the field plate portion 142 of the drain electrode 106 is able to be changed in three steps. Thus, it is possible to further prevent occurrence of breakage of the drain electrode 106 at a step portion. In addition, it is possible to increase a total film thickness of the insulating films, further reduce electric field strength of the surface of the nitride semiconductor laminate 104, and suppress collapse under high voltage during a switching operation.

The third insulating film 511 is desired to be an insulating film whose dielectric constant is smaller than that of the first insulating film 109 or the second insulating film 110. This is because, when an upper film has a smaller dielectric constant, concentration of the electric field is able to be brought away from the surface of the nitride semiconductor laminate 104, so that influence of the collapse on the 2DEG 107 is able to be reduced. Thus, as a material of the third insulating film 511, in addition to $SiO_2$, SiN having a higher composition of N than the first insulating film 109 or the second insulating film 110, in particular, $SiN_w$ (w=4/3) of stoichiometry, $SiN_w$ (w>4/3) having high composition of N, SiON, SiOC, or the like is used.

Figure 6:
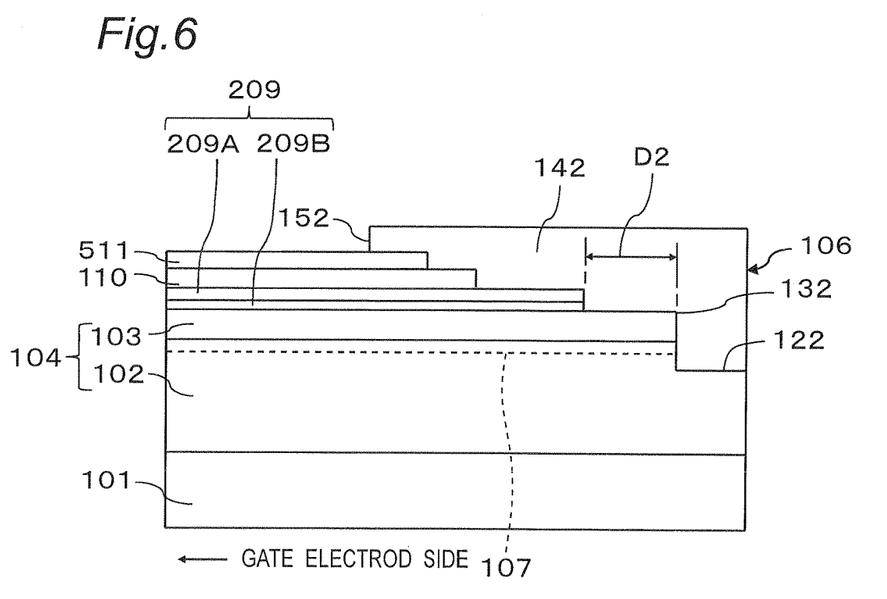
FIG. 6 is a schematic sectional view of a vicinity of a drain electrode of a modified example of the nitride-semiconductor field-effect transistor of the fourth embodiment.
Figure 7:
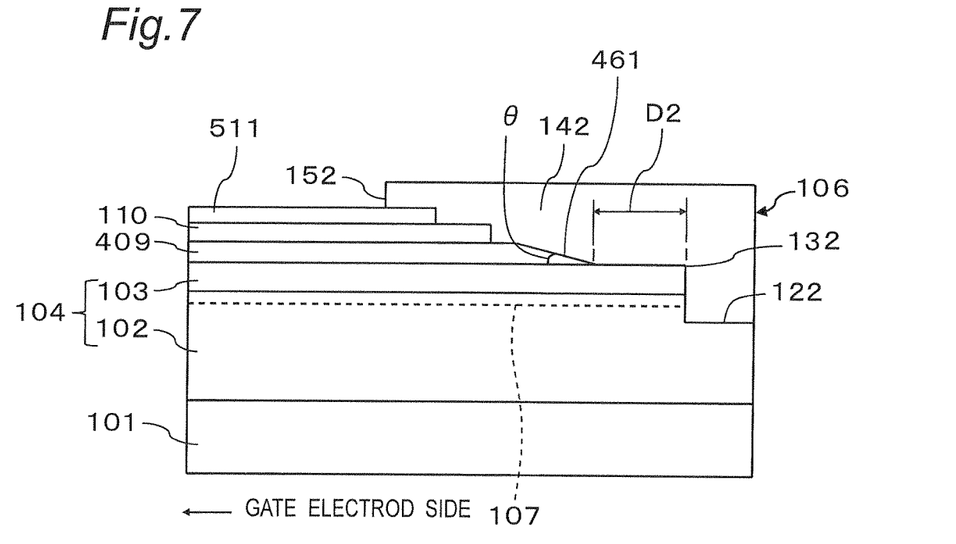
FIG. 7 is a schematic sectional view of a vicinity of a drain electrode of another modified example of the nitride-semiconductor field-effect transistor of the fourth embodiment.

In the fourth embodiment, between the nitride semiconductor laminate 104 and the second insulating film 110, the first insulating film 209 of the second embodiment may be formed as illustrated in FIG. 6 or the first insulating film 409 of the fourth embodiment may be formed as illustrated in FIG. 7.

Fifth Embodiment

Figure 8:
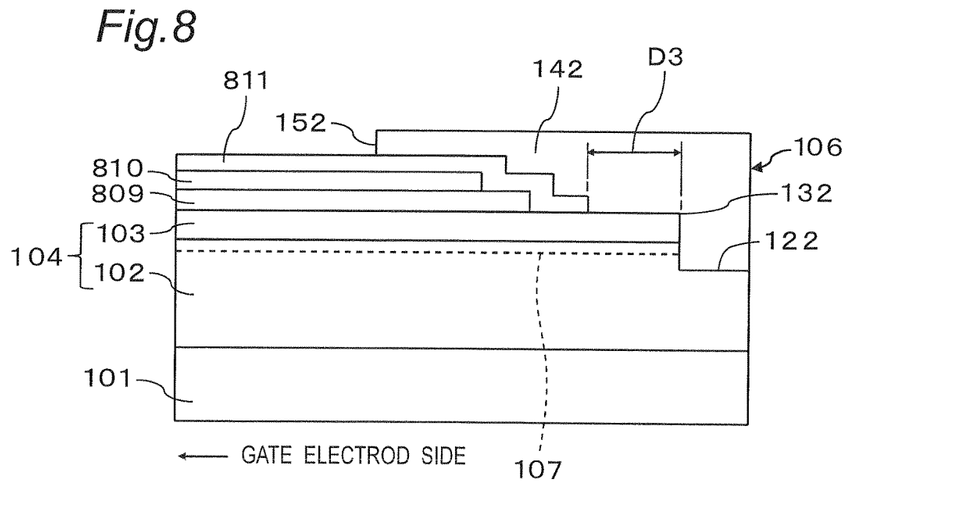
FIG. 8 is a schematic sectional view of a vicinity of a drain electrode of a nitride-semiconductor field-effect transistor of a fifth embodiment of the invention.

FIG. 8 is a schematic sectional view of a vicinity of a drain electrode 106 of a nitride-semiconductor field-effect transistor of a fifth embodiment of the invention. Note that, in FIG. 8, the same components as the components of the first embodiment are denoted by the same reference signs as those of the first embodiment. Also in the description below, the same components as the components of the first embodiment are denoted by the same reference signs as those of the first embodiment and description for the same components is omitted.

The nitride-semiconductor field-effect transistor is a nitride-semiconductor HFET and is different from that of the first embodiment only in that a first insulating film 809, a second insulating film 810, and a third insulating film 811 are included as illustrated in FIG. 8.

The first and second insulating films 809 and 810 are made from the same materials as those of the first and second insulating films 109 and 110, but have different shapes. More specifically, the first insulating film 809 is formed on the surface of the nitride semiconductor laminate 104 and an end on the recess 122 side is separated by a predetermined distance from the opening edge 132 of the recess 122. The distance is set to be longer than the distance D2 of the first embodiment. An end on the recess 122 side of the second insulating film 810 is separated by a predetermined distance from the end on the recess 122 side of the first insulating film 809. Note that, in the fifth embodiment, a film thickness of the first insulating film 809 is set to, for example, 30 nm, and a film thickness of the second insulating film 810 is set to, for example, 100 nm.

The third insulating film 811 has a part formed on the second insulating film 810 and has another part formed on the surface of the nitride semiconductor laminate 104 between the end on the recess 122 side of the first insulating film 809 and the opening edge 132 of the recess 122. More specifically, the third insulating film 811 is made from $SiO_2$, formed over a part of the surfaces of the first insulating film 109 and the nitride semiconductor laminate 104 from the surface of the second insulating film 110, and contacts the surfaces of the nitride semiconductor laminate 104, the first insulating film 109, and the second insulating film 110. An end on the recess 122 side of the third insulating film 811 is separated by a predetermined distance D3 from the opening edge 132 of the opening edge 132. Note that, a film thickness of the third insulating film 811 is set to, for example, 200 nm, and the distance D3 is set to, for example, 0.5 μm.

A part of the drain electrode 106 is in the recess 122. A part of the drain electrode 106 out of the recess 122 stretches toward the gate electrode 108 side in an eaves shape, is formed over the surfaces of the nitride semiconductor laminate 104 and the third insulating film 811 from the recess 122, and contacts the surfaces of the nitride semiconductor laminate 104 and the third insulating film 811. That is, the drain electrode 106 has the field plate portion 142 that stretches toward the gate electrode 108 side in an eaves shape and contacts the surface of the nitride semiconductor laminate 104 and the surface of the third insulating film 811. Such a field plate structure makes it possible to reduce electric field strength of a lower part of the field plate portion 142, particularly, electric field strength near the opening edge 132. Further, when the field plate portion 142 is formed so that the thickness of the field plate portion 142 gradually increases toward the recess 122, electric field strength near the drain electrode 106 is able to be further reduced and occurrence of breakage of the drain electrode 106 at a step portion is able to be prevented.

As described above, when the insulating films that cover the surface of the nitride semiconductor laminate 104 and are positioned under the field plate portion 142 of the drain electrode 106 have a three-layer structure, the thickness of the field plate portion 142 of the drain electrode 106 is able to be changed in three steps. Thus, it is possible to further prevent occurrence of breakage of the drain electrode 106 at a step portion. In addition, it is possible to increase a total film thickness of the insulating films on the nitride semiconductor laminate 104, further reduce electric field strength of the surface of the nitride semiconductor laminate 104, and suppress collapse under high voltage during a switching operation.

The third insulating film 811 is desired to be an insulating film whose dielectric constant is smaller than that of the first insulating film 809 or the second insulating film 810. This is because, when an upper film has a smaller dielectric constant, concentration of electric field is able to be brought away from the surface of the nitride semiconductor laminate 104, so that influence of the collapse on the 2DEG 107 is able to be reduced. Thus, as a material of the third insulating film 811, in addition to $SiO_2$, SiN having a higher composition of N than the first insulating film 809 or the second insulating film 810, in particular, $SiN_w$ (w=4/3) of stoichiometry, $SiN_w$ (w>4/3) having high composition of N, SiON, SiOC, or the like is used.

For a reason similar to that of D2 of the first embodiment, the distance D3 between the end on the recess 122 side of the third insulating film 811 and the opening edge 132 of the opening edge 132 is desired to be 0.1 µm or more and 1.5 µm or less.

In the fifth embodiment, since there is no area interposing the third insulating film 811 whose dielectric constant is low between the nitride semiconductor laminate 104 and the drain electrode 106, it is possible to reduce the electric field of the surface of the nitride semiconductor laminate 104 in a wide range. Thus, it is possible to further suppress collapse under high voltage during a switching operation.

In the fifth embodiment as well, an insulating film similar to the first insulating film 209 of the second embodiment or the first insulating film 409 of the fourth embodiment may be formed between the nitride semiconductor laminate 104 and the second insulating film 810.

In the fifth embodiment, the end on the recess 122 side of the second insulating film 810 is separated by a predetermined distance from the end on the recess 122 side of the first insulting film 809, but may be set not to be separated by a predetermined distance from the end on the recess 122 side of the first insulating film 809. That is, the end on the recess 122 side of the second insulating film 810 may match the end on the recess 122 side of the first insulating film 809.

Though an ohmic electrode is formed by laminating Ti/Al/TiN in the first to fifth embodiments, there is no limitation thereto, and the ohmic electrode may be formed without using TiN or may be formed by laminating Ti/Al and then laminating Au, Ag, Pt, or the like thereon.

Though the nitride-semiconductor field-effect transistor using the Si substrate has been described in the first to fifth embodiments, a sapphire substrate or an SiC substrate may be used without limitation to the Si substrate. That is, the nitride semiconductor laminate may be grown over the sapphire substrate or the SiC substrate.

When a substrate formed by a nitride semiconductor is used in the first to fifth embodiments, the nitride semiconductor laminate may be grown over the substrate formed by the nitride semiconductor, for example, by making an AlGaN layer grown over a GaN substrate.

In the first to fifth embodiments, a buffer layer may be formed between the substrate and the nitride semiconductor laminate, or an AlN hetero-characteristic-improving layer whose layer thickness is about 1 nm may be formed between the AlGaN barrier layer 103 and the GaN channel layer 102 in the nitride semiconductor laminate 104.

Though the normally-on nitride-semiconductor HFET has been described in the first to fifth embodiments, the invention may be applied to, for example, a normally-off nitride-semiconductor HFET.

The structure of the source electrode 105 is formed in a similar manner to the structure of the drain electrode 106 in the first to fifth embodiments, but may be formed to be different from the structure of the drain electrode 106. For example, a whole of the source electrode 105 is formed on the surface of the nitride semiconductor laminate 104 so as not to be partially in the recess 121.

The nitride semiconductor of the nitride-semiconductor field-effect transistor of the invention is only required to be expressed by $Al_xIn_yGa_{1-x-y}N$ (x≤0, y≤0, 0≤x+y≤1).

Though specific embodiments of the invention have been described, the invention is not limited to the aforementioned embodiments and various modifications may be made within a scope of the invention. For example, one obtained by appropriately combining the contents described in the first to fourth embodiments may be used as an embodiment of the invention.

That is, the invention and the embodiments are summarized as follows.

The invention and the embodiments are summarized as follows.

A nitride-semiconductor field-effect transistor of the invention includes a nitride semiconductor laminate 104 that has a heterointerface and has a recess 122 recessed from a surface toward the heterointerface, a source electrode 105 that is arranged on the surface of the nitride semiconductor laminate 104, a drain electrode 106 that is arranged with an interval from the source electrode 105 on the surface of the nitride semiconductor laminate 104 and that is partially in the recess 122, a gate electrode 108 that is arranged between the source electrode 105 and the drain electrode 106, a first insulating film 109, 209, or 409 that is formed on the surface of the nitride semiconductor laminate 104 and includes at least silicon and nitrogen as constituent elements, and a second insulating film 110 that is formed on the first insulating film 109, 209, or 409, in which an end on a recess 122 side of the first insulating film 109, 209, or 409 is separated by a distance D2 that is set in advance from an opening edge 132 of the recess 122 and an end on a recess 122 side of the second insulating film 110 is separated by a distance D12 that is set in advance from the end on the recess 122 side of the first insulating film 109, 209, or 409, and a part of the drain electrode 106 out of the recess 122 stretches toward a gate electrode 108 side in an eaves shape, is formed over surfaces of the nitride semiconductor laminate 104, the first insulating film 109, 209, or 409, and the second insulating film 110 from the recess 122, and contacts the surfaces of the nitride semiconductor laminate 104, the first insulating film 109, 209, or 409, and the second insulating film 110.

According to the aforementioned configuration, the part of the drain electrode 106 out of the recess 122 stretches toward the gate electrode 108 side in an eaves shape, is formed over the surfaces of the nitride semiconductor laminate 104, the first insulating film 109, 209, or 409, and the second insulating film 110 from the recess 122, and contacts the surfaces of the nitride semiconductor laminate 104, the first insulating film 109, 209, or 409, and the second insulating film 110. Thereby, it is possible to gradually increase thickness of the part of the drain electrode 106 out of the recess 122 toward the recess 122 side of the nitride semiconductor laminate 104. Thus, since it is possible to greatly reduce electric field strength near the drain electrode 106, collapse is able to be suppressed even under high voltage during a switching operation.

Since the end on the recess 122 side of the first insulating film 109, 209, or 409 is separated by the distance D2 that is set in advance from the opening edge 132 of the recess 122, the recess 122 of the nitride semiconductor laminate 104 and the first insulating film 109, 209, or 409 are able to be subjected to etching processing separately. Thus, depth of the recess 122 and a processing shape of a side surface of the recess 122 are able to be easily controlled by etching. As a result, it is possible to achieve stable ohmic contact resistance of the nitride semiconductor laminate 104 and the drain electrode 106 and stable on-resistance.

In the nitride-semiconductor field-effect transistor of an embodiment, the distance D2 between the end on the recess 122 side of the first insulating film 109, 209, or 409 and the opening edge 132 of the recess 122 is 0.1 μm or more and 1.5 μm or less.

According to the aforementioned embodiment, when the distance D2 between the end on the recess 122 side of the first insulating film 109, 209, or 409 and the opening edge 132 of the recess 122 is 0.1 μm or more, it is possible to reliably perform separate etching processing of the recess 122 of the nitride semiconductor laminate 104 and the first insulating film 109, 209, or 409.

When the distance D2 between the end on the recess 122 side of the first insulating film 109, 209, or 409 and the opening edge 132 of the recess 122 is 1.5 μm or less, it is possible to sufficiently suppress collapse under high voltage during a switching operation.

In the nitride-semiconductor field-effect transistor of an embodiment, the first insulating film 209 has an area in contact with the surface of the nitride semiconductor laminate 104, and the area is made from SiN whose Si—H bonding amount is $6\times10^{21}$ cm$^{-3}$ or less.

According to the aforementioned embodiment, when the Si—H bonding amount of SiN forming the area is $6\times10^{21}$ cm$^{-3}$ or less, it is possible to suppress an increase in leak current by a high-temperature and high-voltage stress test.

In the nitride-semiconductor field-effect transistor of an embodiment, an end surface 461 on the recess 122 side of the first insulating film 409 is inclined at an angle of 30° or less relative to an interface between the nitride semiconductor laminate 104 and the first insulating film 409.

According to the aforementioned embodiment, when the end surface on the recess 122 side of the first insulating film 409 is inclined at an angle of 30° or less, it is possible to enhance effect of reducing electric field strength near the drain electrode 106.

A nitride-semiconductor field-effect transistor of the invention includes a nitride semiconductor laminate 104 that has a heterointerface and has a recess 122 recessed from a surface toward the heterointerface, a source electrode 105 that is arranged on the surface of the nitride semiconductor laminate 104, a drain electrode 106 that is arranged with an interval from the source electrode 105 on the surface of the nitride semiconductor laminate 104 and that is partially in the recess 122, a gate electrode 108 that is arranged between the source electrode 105 and the drain electrode 106, a first insulating film 809 that is formed on the surface of the nitride semiconductor laminate 104, has an end on a recess 122 side separated by a distance that is set in advance from an opening edge 132 of the recess 122, and includes at least silicon and nitrogen as constituent elements, a second insulating film 810 that is formed on the first insulating film 809, and a third insulating film 811 that has a part formed on the second insulating film 810 and has another part formed on the surface of the nitride semiconductor laminate 104 between the end on the recess 122 side of the first insulating film 809 and the opening edge 132 of the recess 122, in which an end on a recess 122 side of the third insulating film 811 is separated by a distance D3 that is set in advance from the opening edge 132 of the recess 122, and a part of the drain electrode 106 out of the recess 122 stretches toward a gate electrode 108 side in an eaves shape, is formed over surfaces of the nitride semiconductor laminate 104 and the third insulating film 811 from the recess 122, and contacts the surfaces of the nitride semiconductor laminate 104 and the third insulating film 811.

According to the aforementioned configuration, the part of the drain electrode 106 out of the recess 122 stretches toward the gate electrode 108 side in an eaves shape, is formed over the surfaces of the nitride semiconductor laminate 104 and the third insulating film 811 from the recess 122, and contacts the surfaces of the nitride semiconductor laminate 104 and the third insulating film 811. Thereby, it is possible to gradually increase thickness of the part of the drain electrode 106 out of the recess 122 toward the recess 122 side of the nitride semiconductor laminate 104. Thus, since it is possible to greatly reduce electric field strength near the drain electrode 106, collapse is able to be suppressed even under high voltage during a switching operation.

Since the end on the recess 122 side of the third insulating film 811 is separated by the distance D3 that is set in advance from the opening edge 132 of the recess 122, the recess 122 of the nitride semiconductor laminate 104 and the third insulating film 811 are able to be subjected to etching processing separately. Thus, depth of the recess 122 and a processing shape of a side surface of the recess 122 are able to be easily controlled by etching. As a result, it is possible to achieve stable ohmic contact resistance of the nitride semiconductor laminate 104 and the drain electrode 106 and stable on-resistance.

REFERENCE SIGNS LIST 101 substrate
102 channel layer 103 barrier layer
104 nitride semiconductor laminate
105 source electrode
106 drain electrode
107 2DEG
108 gate electrode
109, 209, 409, 809 first insulating film
110, 810 second insulating film
141, 142 field plate portion
121, 122 recess
131, 132 opening edge
151, 152 tip end
209A first lower insulating film
209B first upper insulating film
461 side surface
511, 811 third insulating film
D1, D2, D3, D11, D12 distance
θ angle

The invention claimed is:

1. A nitride-semiconductor field-effect transistor, comprising:
   a nitride semiconductor laminate that has a heterointerface and has a recess recessed from a surface toward the heterointerface;
   a source electrode that is arranged on the surface of the nitride semiconductor laminate;
   a drain electrode that is arranged with an interval from the source electrode on the surface of the nitride semiconductor laminate and that is partially in the recess;
   a gate electrode that is arranged between the source electrode and the drain electrode;
   a first insulating film that is formed on the surface of the nitride semiconductor laminate, has an end on a recess side separated by a distance that is set in advance from an opening edge of the recess, and includes at least silicon and nitrogen as constituent elements;
   a second insulating film that is formed on the first insulating film; and
   a third insulating film that has a part formed on the second insulating film and has another part formed on the surface of the nitride semiconductor laminate between the end on the recess side of the first insulating film and the opening edge of the recess, wherein
   an end on a recess side of the third insulating film is separated by a distance that is set in advance from the opening edge of the recess, and
   a part of the drain electrode out of the recess stretches toward a gate electrode side in an eaves shape, is formed over surfaces of the nitride semiconductor laminate and the third insulating film from the recess, and contacts the surfaces of the nitride semiconductor laminate and the third insulating film.

2. The nitride-semiconductor field-effect transistor according to claim 1, wherein
   a dielectric constant of the third insulating film is smaller than that of at least one of the first insulating film and the second insulating film.

3. The nitride-semiconductor field-effect transistor according to claim 1, wherein
   the distance between the end on the recess side of the third insulating film and the opening edge of the recess is 0.1 μm or more and 1.5 μm or less.

4. The nitride-semiconductor field-effect transistor according to claim 2, wherein
   the distance between the end on the recess side of the third insulating film and the opening edge of the recess is 0.1 μm or more and 1.5 μm or less.

* * * * *